US008222111B1

(12) United States Patent
Hwang

(10) Patent No.: US 8,222,111 B1
(45) Date of Patent: Jul. 17, 2012

(54) SIMULTANEOUS FORMATION OF A TOP OXIDE LAYER IN A SILICON-OXIDE-NITRIDE-OXIDE-SILICON (SONOS) TRANSISTOR AND A GATE OXIDE IN A METAL OXIDE SEMICONDUCTOR (MOS)

(75) Inventor: Jeong-Mo Hwang, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 12/782,699

(22) Filed: May 18, 2010

Related U.S. Application Data

(62) Division of application No. 11/615,683, filed on Dec. 22, 2006, now abandoned.

(51) Int. Cl.
*H01L 21/8234* (2006.01)
*H01L 21/336* (2006.01)
*H01L 21/31* (2006.01)

(52) U.S. Cl. ........ 438/275; 438/287; 438/288; 438/787; 257/E21.625; 257/E29.202; 257/E29.309; 257/E21.423

(58) Field of Classification Search .................. 438/275, 438/287, 288, 787; 257/E21.625, E29.309, 257/E21.423
See application file for complete search history.

(56) References Cited

U.S. PATENT DOCUMENTS

| | | | |
|---|---|---|---|
| 5,912,487 A * | 6/1999 | Hong | ............................ 257/315 |
| 6,136,647 A | 10/2000 | Sung | |
| 6,791,156 B2 | 9/2004 | Itou | |
| 7,020,007 B2 | 3/2006 | Kwon | |
| 7,098,147 B2 | 8/2006 | Nansei et al. | |
| 7,183,166 B2 | 2/2007 | Wang et al. | |
| 7,250,654 B2 | 7/2007 | Chen et al. | |
| 2005/0077591 A1 * | 4/2005 | Fukuda et al. | ................. 257/500 |
| 2005/0110102 A1 * | 5/2005 | Wang et al. | ................... 257/411 |
| 2005/0141266 A1 | 6/2005 | Jung | |
| 2006/0017092 A1 * | 1/2006 | Dong et al. | .................... 257/314 |
| 2006/0228899 A1 * | 10/2006 | Nansei et al. | ................. 438/769 |
| 2007/0026605 A1 | 2/2007 | Pan et al. | |
| 2007/0042606 A1 | 2/2007 | Wang et al. | |
| 2007/0102754 A1 * | 5/2007 | Chen et al. | ..................... 257/324 |
| 2008/0150002 A1 | 6/2008 | Hwang | |

OTHER PUBLICATIONS

USPTO Non-Final Rejection for U.S. Appl. No. 11/615,683 dated Nov. 19, 2009; 13 pages.
USPTO Final Rejection for U.S. Appl. No. 11/615,683 dated Jun. 17, 2009; 13 pages.
USPTO Non-Final Rejection for U.S. Appl. No. 11/615,683 dated Jan. 13, 2009; 10 pages.
USPTO Final Rejection for U.S. Appl. No. 11/615,683 dated May 30, 2008; 10 pages.
USPTO Non-Final Rejection for U.S. Appl. No. 11/615,683 dated Nov. 28, 2007; 7 pages.

(Continued)

*Primary Examiner* — Kevin Parendo

(57) ABSTRACT

A method for semiconductor fabrication. The method includes providing a silicon substrate and forming a tunnel oxide layer over the silicon substrate. Thereafter, a nitride layer is formed over the tunnel oxide layer. The nitride layer and the tunnel oxide layer are etched except where at least one nonvolatile silicon oxide nitride oxide silicon (SONOS) transistor is formed. Additionally, oxide layers are simultaneously formed over the nitride layer corresponding to where at bast one SONOS memory transistor is formed and over the exposed silicon substrate corresponding to where at least one metal oxide semiconductor (MOS) transistor is formed.

8 Claims, 7 Drawing Sheets

OTHER PUBLICATIONS

USPTO Requirement for Restriction/Election for U.S. Appl. No. 11/615,683 dated Oct. 12, 2007; 10 pages.

SIMTEK "Quantum Trap nvSRAM Technology," Simtek Corporation, 1999; 5 pages.

* cited by examiner

SIMULTANEOUS FORMATION OF A TOP OXIDE LAYER IN A SILICON-OXIDE-NITRIDE-OXIDE-SILICON (SONOS) TRANSISTOR AND A GATE OXIDE IN A METAL OXIDE SEMICONDUCTOR (MOS)

BACKGROUND OF THE INVENTION

1. Field of Invention

The present invention relates to the field of microelectronic integrated circuits. Specifically, the present invention relates to simultaneous formation of the top oxide in a nonvolatile silicon oxide nitride oxide silicon (SONOS) based nonvolatile memory transistor and a gate oxide for a metal oxide semiconductor (MOS) transistor included within control circuits.

2. The Relevant Technology

Some semiconductor chips include SONOS based nonvolatile memory transistors, and MOS transistors in various configurations. In particular, the MOS transistors are located within control circuits, which can be located in the nonvolatile memory array, volatile memory array, or a peripheral control circuit. The MOS transistors in the control circuits include, in part, pass gate transistors in the nonvolatile memory array for controlling access to SONOS based nonvolatile memory transistors, peripheral MOS transistors in the peripheral control circuit, and volatile transistors in the volatile memory array.

A current process flow for fabricating a nonvolatile memory device separately forms the top oxide in a oxide-nitride-oxide (ONO) structure and a gate oxide of a MOS transistor used in a control circuit. Specifically, the tunnel oxide, nitride, and the top oxide are sequentially formed on a silicon substrate for the ONO structure. The top oxide layer is typically a deposited oxide which is not dense and easily etched during subsequent cleaning processes. As such, the top oxide layer may be further densified to minimize losses to the top oxide layer in further processing steps.

The ONO layers are patterned and etched from the silicon surface except for areas where the SONOS memory transistors are formed. Also, the gate oxides of MOS transistors located on the semiconductor chip are formed separately through thermal oxidation. Unfortunately, even after densification, the top oxide of the ONO structure is susceptible to etching during subsequent cleaning steps, which results in a non-uniform top oxide layer of the ONO structure. As a result, the thickness of the top oxide layer in the ONO structure is hard to control, which can lead to lower yields.

SUMMARY OF THE INVENTION

A method for semiconductor fabrication includes providing a silicon substrate and forming a tunnel oxide layer over the silicon substrate. Thereafter, a nitride layer is formed over the tunnel oxide layer. The nitride layer and the tunnel oxide layer are etched except where at least one nonvolatile silicon oxide nitride, oxide silicon (SONOS) transistor is formed. Additionally, oxide layers are simultaneously formed over the nitride layer corresponding to where at least one SONOS memory transistor is formed and over the exposed silicon substrate corresponding to where at least one metal oxide semiconductor (MOS) transistor is formed.

In an alternate configuration, a semiconductor chip includes a silicon-oxide-nitride-oxide-silicon (SONOS) nonvolatile memory transistor. The SONOS based nonvolatile memory transistor comprises an oxide-nitride-oxide (ONO) structure, wherein the ONO structure comprises a top oxide layer. The semiconductor chip also includes at least one MOS transistor, wherein the MOS transistor includes a gate oxide formed from a gate oxide layer, wherein a quality of the top oxide layer is substantially similar to a quality of the gate oxide layer of the at least one MOS transistor.

BRIEF DESCRIPTION OF THE DRAWINGS

Exemplary embodiments are illustrated in referenced figures of the drawings which illustrate what is regarded as the preferred embodiments presently contemplated. It is intended that the embodiments and figures disclosed herein are to be considered illustrative rather than limiting.

DETAILED DESCRIPTION OF THE PREFERRED EMBODIMENTS

Reference will now be made in detail to the preferred embodiments of the present invention, a method for simultaneous formation of the top oxide of a SONOS transistor and a gate oxide of at least one MOS transistor located in a control circuit. While the invention will be described in conjunction with the preferred embodiments, it will be understood that they are not intended to limit the invention to these embodiments. On the contrary, the invention is intended to cover alternatives, modifications and equivalents which may be included within the spirit and scope of the invention as defined by the appended claims.

Accordingly, embodiments of the present invention provide for simultaneous fabrication of the top oxide of the SONOS based nonvolatile memory transistor and a gate oxide of at least one MOS transistor, located in a control circuit. In particular, in one embodiment, the SONOS based nonvolatile memory device has a more uniform thickness for the top oxide layer of the ONO structure of the SONOS based nonvolatile memory transistor. Also, in other embodiments, simultaneous fabrication of the top oxide of the SONOS based nonvolatile memory transistor and a gate oxide of at least one MOS transistor, located in a control circuit, reduces the number of processing steps which saves the overall process costs for manufacturing, for example of a nonvolatile static random access memory (nvSRAM) memory device. In addition, in other embodiments simultaneous formation of the top oxide layer in the ONO structure of the SONOS based nonvolatile memory transistor and the gate oxide of the MOS transistor, located in a control circuit, improves the overall quality of the top oxide layer of the SONOS based nonvolatile memory transistor to as good as the gate oxide of the MOS transistors. These characteristics can lead to increased yields for the semiconductor chip.

Figure 1:
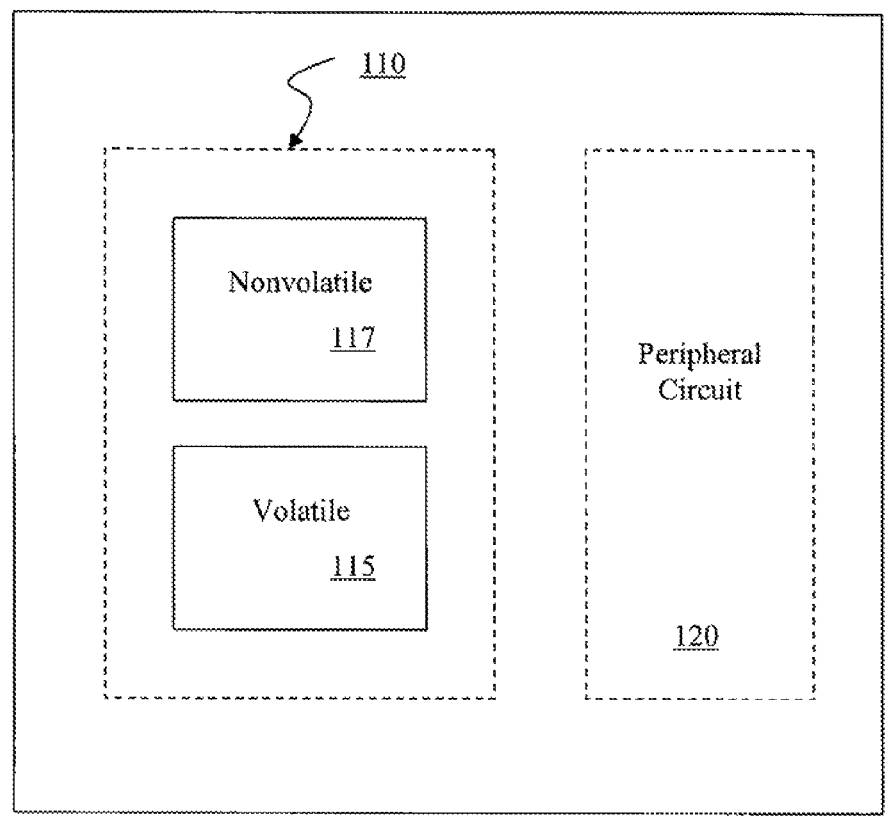
FIG. 1 is a simplified block diagram illustrating a semiconductor chip implementing the simultaneous formation of oxide layers, in accordance with one embodiment of the present invention.

For illustration, FIG. 1 illustrates a simplified functional block diagram of a general semiconductor chip 100 implementing the simultaneous formation of a top oxide layer of a SONOS based nonvolatile memory transistor and a gate oxide layer for MOS transistors located in control circuits, in accordance with one embodiment of the present invention. In particular, the semiconductor chip 100 includes a memory array 110, and a peripheral control circuit 120 for supporting and controlling, in part, the memory array 110.

The memory array 110 includes two different memory arrays comprising a volatile memory 115 and a nonvolatile memory 117. Peripheral circuit 120 controls the volatile memory 115, nonvolatile memory 117, and any other chip functions. The peripheral circuit 120 is partly comprised of MOS transistors, for example in any of a variety of complementary metal oxide semiconductor (CMOS) configurations, each of which includes a pair of n-channel MOS and p-channel MOS transistors.

The volatile memory 115 includes a plurality of volatile memory cells, such as static random access memory (SRAM) cells, each of which is capable of storing and communicating a single bit of data to and from an external environment that is outside of the memory array 110, or communicating internally with the nonvolatile memory 117. More particularly, each volatile memory cell in the volatile portion 115 is capable, as long as power is being supplied, of receiving a bit of data from the exterior environment, including the nonvolatile memory 117 and peripheral control circuit 120, retaining the bit of data, and transmitting the bit of data back to the exterior environment.

The nonvolatile memory 117 includes a plurality of nonvolatile memory cells for providing backup storage to the plurality of volatile memory cells in the volatile memory 115. The nonvolatile cells each comprises a SONGS based memory transistor, wherein the ONO layer comprises a top oxide layer. In general, the nonvolatile memory 117 includes a combination of a plurality of SONOS based nonvolatile memory transistors and pass-gate MOS transistors.

More particularly, each volatile memory cell can be associated with at least one corresponding nonvolatile memory cell that prevents the loss of data from the plurality of volatile memory cells due to a loss of power, for example.

Embodiments of the present invention are implemented for the simultaneous formation of the top oxide layer in each of the SONOS based nonvolatile memory transistors included within the nonvolatile memory 117 of FIG. 1 and the gate oxide layer that is used to form the gate oxides of a plurality of MOS transistors found both within the memory array 110 and the peripheral circuit 120.

Figure 2:
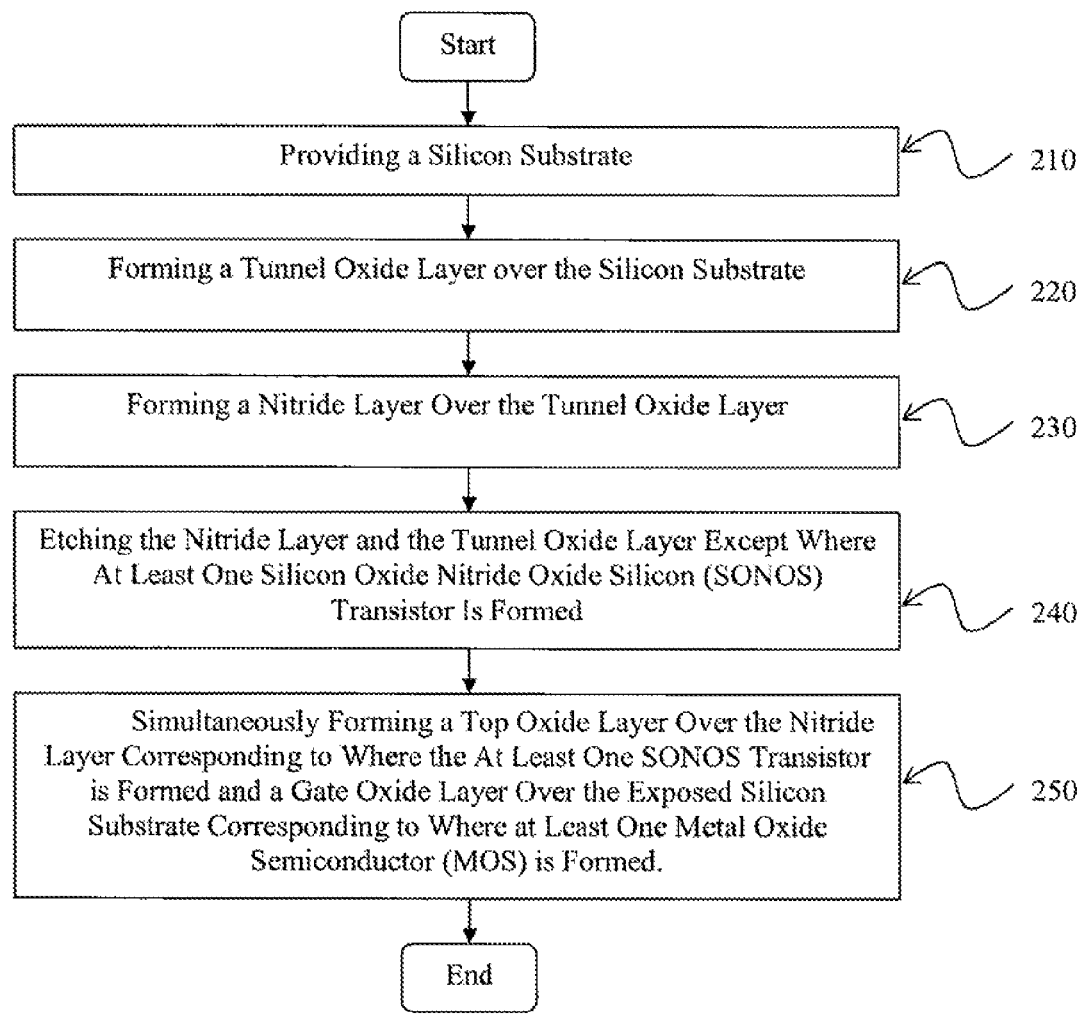
FIG. 2 is a flow diagram illustrating the process flow for simultaneously forming oxide layers in a semiconductor chip, in accordance with one embodiment of the present invention.
Figure 3A:
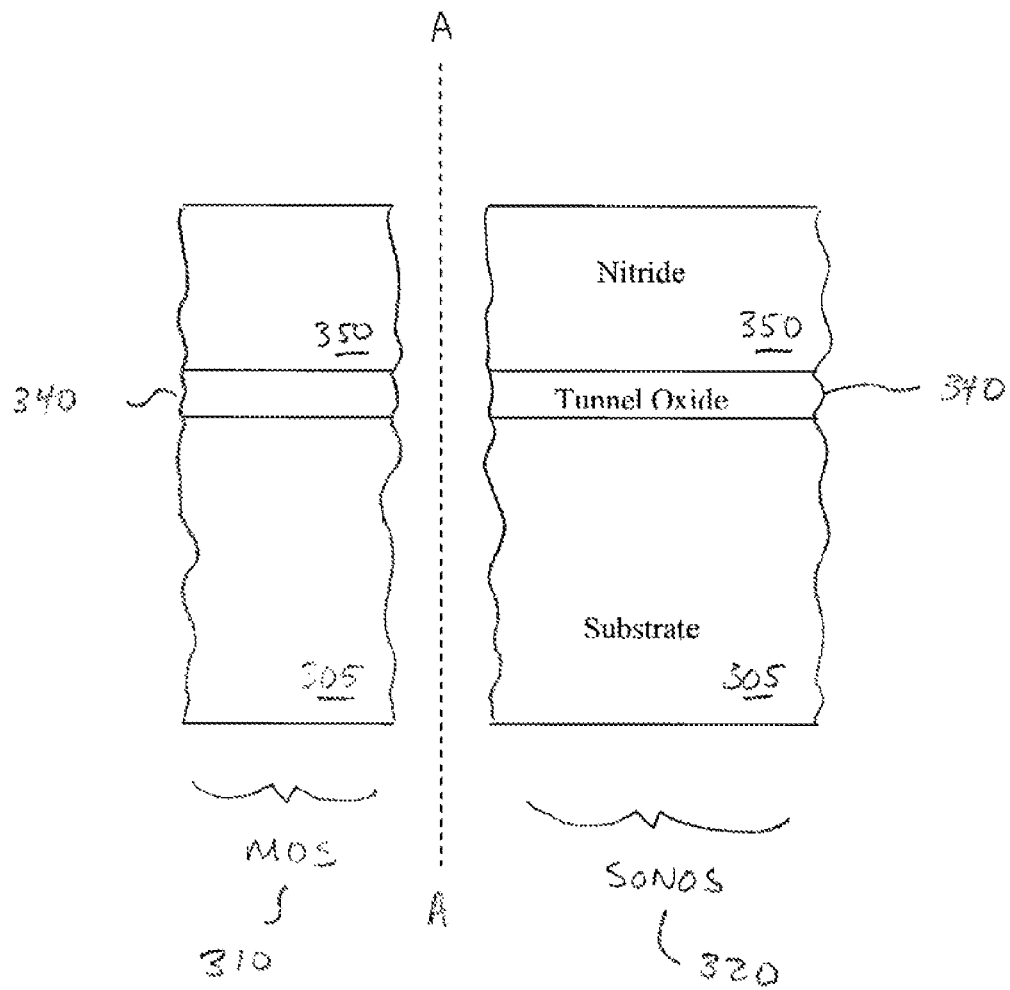
FIG. 3A is a simplified depiction of multiple transistors in cross section showing the formation of the nitride and tunnel oxide layers, in accordance with one embodiment of the present invention.
Figure 3B:
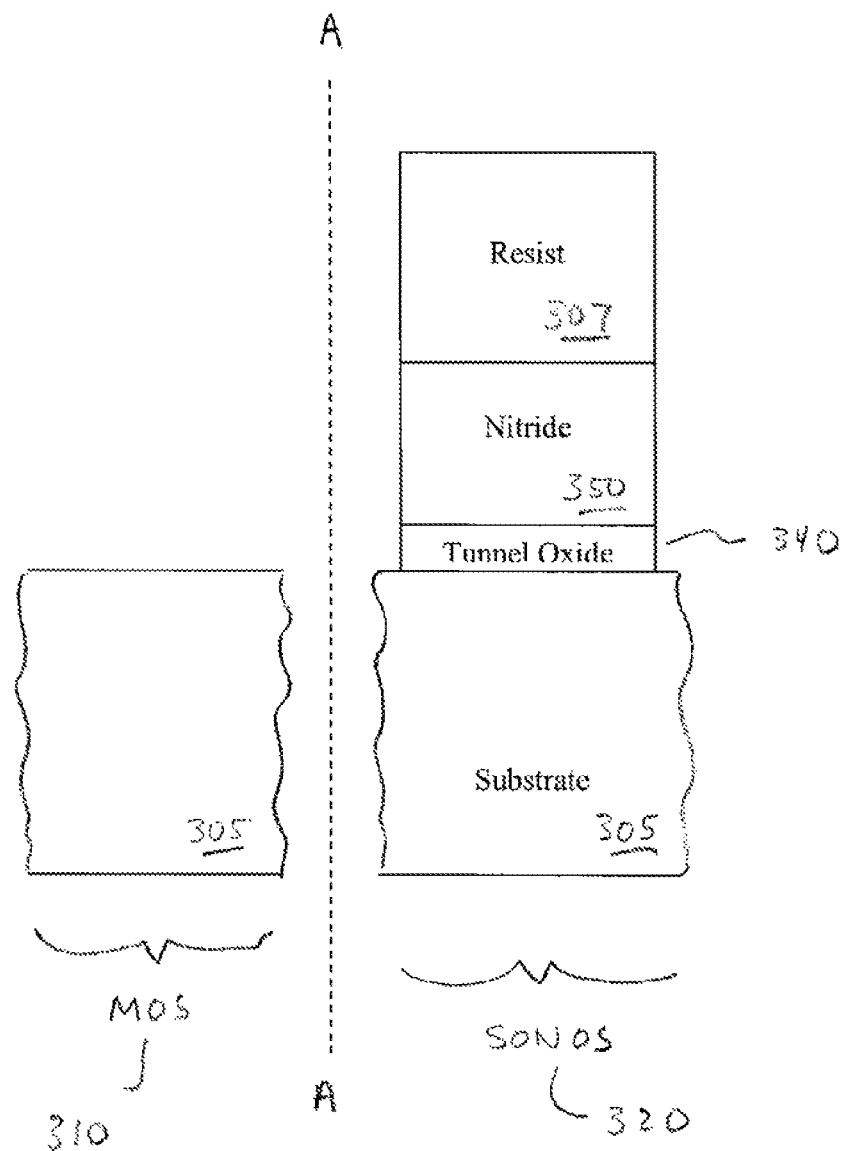
FIG. 3B is a simplified depiction of multiple transistors in cross section showing the isolation of the SONOS memory transistor, in accordance with one embodiment of the present invention.
Figure 3C:
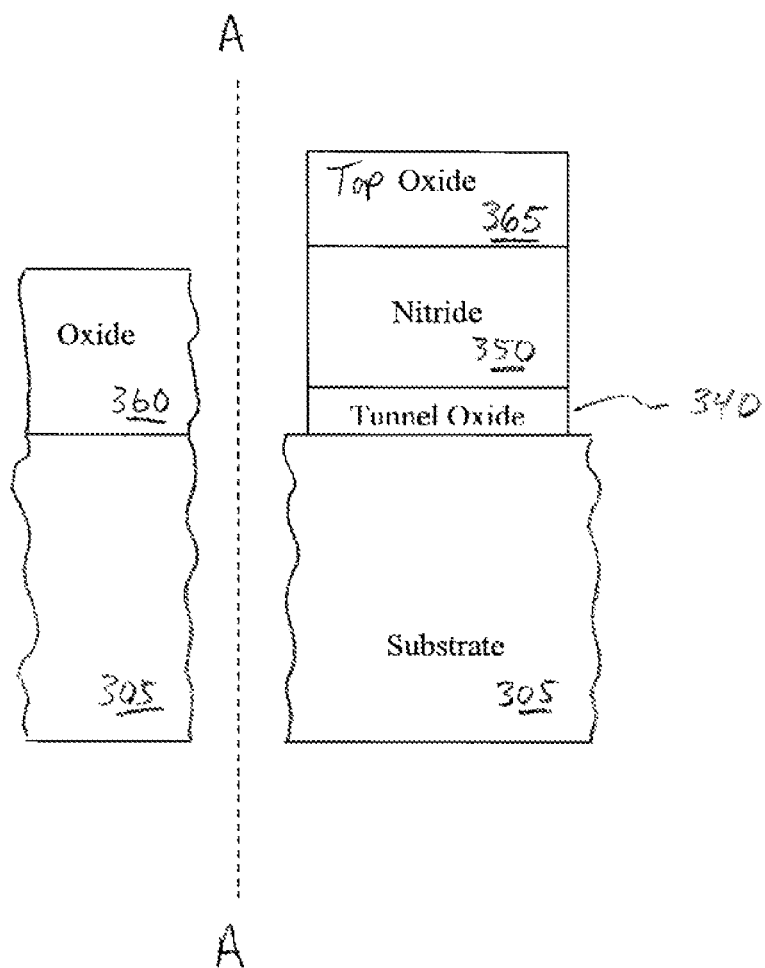
FIG. 3C is a simplified depiction of multiple transistors in cross section showing the simultaneous formation of the top oxide of the SONOS transistor and the gate oxide of a MOS transistor in a control circuit, in accordance with one embodiment of the present invention.

FIG. 2 in combination with FIGS. 3A-C illustrate the simultaneous formation of a top oxide layer in at least one SONOS based transistor and a gate oxide of at least one MOS transistor for a control circuit, in accordance with one embodiment of the present invention. In particular, FIG. 2 is a flow chart illustrating a manufacturing process for the simultaneous formation of the top oxide layer in the SONOS based nonvolatile memory transistor and the gate oxide layer that forms the gate oxide of a MOS transistor of a control circuit, in accordance with one embodiment of the present invention. FIGS. 3A, 3B, and 3C are cross-sections of the SONOS based transistor and at least one MOS transistor during the fabrication of a semiconductor chip (e.g., an nvSRAM memory), in accordance with one embodiment of the present invention. FIGS. 3A, 3B, and 3C are not drawn to scale.

Turning now to FIG. 2, at 210, the present embodiment provides a silicon substrate upon which various circuit elements can be formed. At 220, the present embodiment forms a tunnel oxide layer over the silicon substrate. For example, in FIG. 3A, a cross-section 300A of intermediate formations of multiple transistors is shown, in accordance with one embodiment of the present invention. Specifically, the tunnel oxide layer 340 is formed on the bare silicon substrate 305. The tunnel oxide layer 340 is conventionally formed by thermal oxidation. Other techniques can also be used to form the tunnel oxide layer 340, in other embodiments The multiple transistors shown in FIG. 3A that are formed on the silicon substrate can be located in the semiconductor chip 100 of FIG. 1, in accordance with one embodiment of the present invention. In particular, the SONOS based nonvolatile memory transistors are located in the nonvolatile memory 117, in one embodiment. In still other embodiments, the MOS transistors are located in the control circuits of the semiconductor chip. The control circuits include, in part, the nonvolatile memory 117, the volatile memory 115, and the peripheral circuit 120. In other embodiments, the process of FIG. 2 can be implemented to form any configuration of circuit elements comprising at least one SONOS based transistor and at least one MOS transistor of a control circuit on a semiconductor chip.

As shown in FIG. 3A, a SONOS based transistor 320 is located in the region to the right of line A-A. The SONOS based transistor 320 comprises a nonvolatile memory transistor, in one embodiment.

Also, at least one MOS transistor of a control circuit is formed. For instance, in FIG. 3A, MOS transistor 310 is formed in the region to the left of line A-A. MOS transistor 310 can be formed adjacent to SONOS based transistor 320, in one embodiment. For instance, MOS transistor 310 and SONOS based transistor 320 are configured as an nonvolatile memory (NVM) cell, for example in an nvSRAM architecture, in one embodiment.

In another embodiment, as represented in FIG. 3A MOS transistor 310 is formed peripherally from SONOS based transistor 320. For instance, MOS transistor 310 is formed in the peripheral circuit 120 of FIG. 1. Also in another instance, MOS transistor 310 can be formed in the volatile memory 115 of FIG. 1.

Returning to FIG. 2, at 230, a nitride layer is formed over the tunnel oxide layer, in the present embodiment. In one embodiment, the nitride layer comprises an oxynitride. In the example provided in FIG. 3A, a nitride layer 350 is formed on the top of tunnel oxide layer 340. Nitride layer 350 can be formed using any number of techniques, such as chemical vapor deposition techniques, in embodiments of the present invention.

At 240, the nitride layer and the tunnel oxide layer are selectively etched. For purposes of embodiments of the present invention, etching of the nitride layer and the tunnel oxide layer is analogous with removing the nitride layer and the tunnel oxide layer, in one embodiment. Specifically, the nitride layer and the tunnel oxide layer are etched except where at least one SONOS based nonvolatile memory transistor is formed. In one embodiment, the etching is accomplished after patterning of a masking layer (e.g., photoresist) over a region where the at least one SONOS based nonvolatile memory transistor is formed.

FIG. 3B is a cross section 300B showing the continued formation from FIG. 3A of the semiconductor chip. In the example provided in FIG. 3B, the tunnel oxide layer 340 and nitride layer 350 are etched in the regions corresponding to the formation of MOS transistor 310. That is, resist layer 307 outlines the regions where nitride layer 350 and tunnel oxide layer 340 are etched. In particular, tunnel oxide layer 340 and nitride layer 350 are etched in the region to the left of line A-A, as shown in FIG. A. In this region, the tunnel oxide layer 340 and nitride layer 350 are etched to expose the bare silicon substrate 305.

At 250, oxide layers are simultaneously formed over the nitride layer of at least one SONOS based transistor and over the exposed silicon substrate. That is, the oxide layers are simultaneously formed over the region corresponding to the formation of the SONOS based transistor and the regions where at least one MOS transistor for control circuitry is formed. Specifically, the top oxide layer is formed over the nitride layer of the SONOS based transistor and the gate oxide layer is formed over the exposed silicon substrate corresponding to the formation of at least one MOS transistor located in control circuitry.

In one embodiment, the oxide layers are formed using an oxygen (O2) plasma oxidation technique. As such, the plasma oxidation for the formation of the top oxide layer over the nitride layer in the SONOS based transistor and the gate oxide layer over the exposed silicon substrate used to form the gate oxide of the at least one MOS transistor can be formed at lower temperatures than conventional thermal oxidation techniques, in one embodiment. In still other embodiments, the simultaneous formation of the top oxide layer over the nitride layer in the SONOS based transistor and the gate oxide layer over the exposed silicon substrate that forms the gate oxide of the at least one MOS transistor for control circuitry can be formed by other methods, such as high pressure wet oxidation.

FIG. 3C is a cross section 300C showing the continued formation from FIG. 3B of the transistors of the semiconductor chip. In the example provided in FIG. 3C, a top oxide layer 365 is formed over the nitride layer 350 of the SONOS based transistor 320. In addition, a gate oxide layer 360 is formed simultaneously over the exposed silicon substrate 305. In particular, the gate oxide layer 360 is formed in the regions corresponding to the formation of MOS transistors. In one embodiment, the masking layer 307 is removed prior to the simultaneous formation of the gate oxide layer 360 and the top oxide layer 365. As such, the exposed nitride, in the region corresponding to the formation of SONOS transistor 320, and the exposed silicon substrate in the regions corresponding to the formation of the at least one MOS transistor (e.g., MOS transistor 310) are simultaneously oxidized. That is, nitride layer 350 is effectively oxidized using an O2 plasma oxidation technique at relatively low temperatures, in one embodiment. In addition, the O2 plasma oxidation technique is capable of oxidizing the exposed silicon substrate 305 in the region corresponding to MOS transistor 310.

FIG. 3C illustrates the simultaneous oxidation of nitride layer 350 and the silicon substrate 305. For example, the oxidation rates are different for the top oxide layer 365 and the gate oxide layer 360. As shown in FIG. 3C, the oxidation of silicon occurs at a faster rate than the oxidation of the nitride layer 350. As such, the gate oxide layer 360 is thicker than the top oxide layer 365, in one embodiment.

As provided in the process steps of FIGS. 2 and 3A-3C, in embodiments of the present invention, fewer process steps are needed to form a SONOS based nonvolatile memory transistor and at least one MOS transistor (e.g., MOS transistor 310) in the control circuitry in comparison to chips made prior to embodiments of this invention, thereby simplifying the manufacturing process and saving time, for example. In particular, conventional techniques separately formed the ONO structure for the SONOS based transistor and the gate oxides for the MOS transistor in the control circuitry. This required at least one additional top oxide layer formation step, and an additional densification step of the top oxide layer. Densification using a conventional high temperature furnace process may be required since the top oxide in the ONO structure of the SONOS based transistor is not dense and easily etched during subsequent process steps (e.g., cleaning steps). These subsequent process steps lead to non-uniformity of the top oxide layer in the ONO structure. Additionally, the thickness of the top oxide layer in the ONO structure is not easily controlled because of the etching of the top oxide layer during subsequent process steps.

These densification and separate top oxide formation steps are not required by embodiments of the present invention, which lead to improved top oxide quality of the ONO structure and a more uniform thickness of the top oxide in the ONO structure of the SONOS based nonvolatile memory transistor. For instance, the densification step is not required since the O2 plasma oxidation technique forms a top oxide layer of sufficient density such that subsequent process steps do not significantly erode the top oxide layer. In addition, the quality of the top oxide formed through O2 plasma oxidation is of higher quality than the top oxide formed through deposition using conventional techniques.

Figure 4:
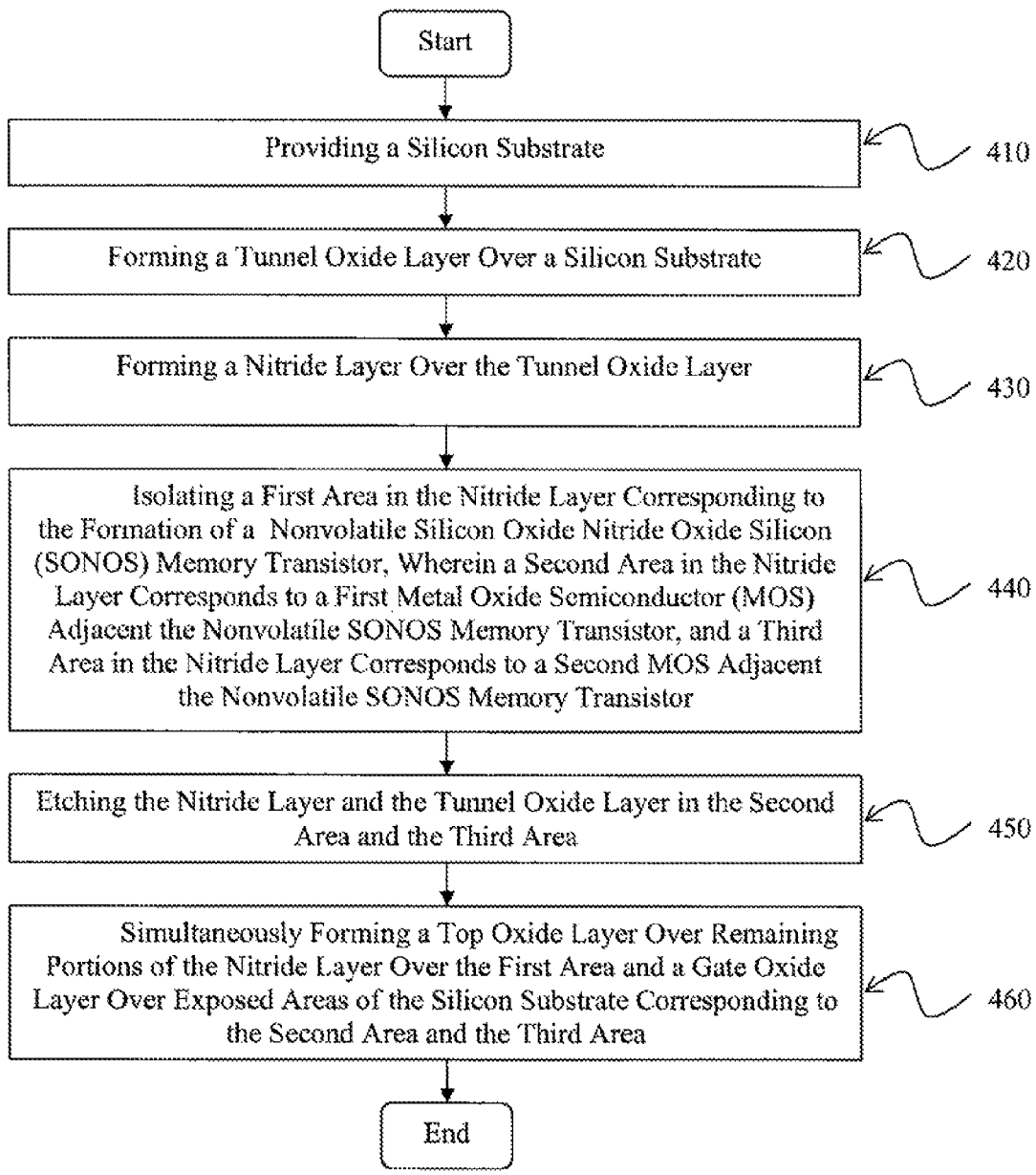
FIG. 4 is a flow diagram illustrating the process flow for simultaneous formation of oxide layers for a SONOS based nonvolatile memory transistor and at least one corresponding pass-gate MOS transistor, in accordance with one embodiment of the present invention.

FIG. 4 is a flow chart illustrating steps in a method for the simultaneous formation of a top oxide layer in a SONOS based nonvolatile memory transistor and the gate oxides of corresponding pass-gate MOS transistors that comprise a tri-gate SONOS based nonvolatile memory cell, in accordance with one embodiment of the present invention. For illustrative purposes, the process described in FIG. 4 can be used to form the tri-gate SONOS based NVM shown in FIG. 5. The embodiment as provided in the method of FIG. 4 provides similar advantages previously described in relation to FIG. 2.

At 410, the present embodiment provides a silicon substrate upon which circuit elements can be formed. At 420, the present embodiment forms a tunnel oxide layer over the silicon substrate. At 430, the present embodiment forms a nitride layer over the tunnel oxide layer. The operation at 410 is analogous to the operation 210 of FIG. 2. In addition, the operations at 420 and 430 are analogous to the operations at 220 and 230, respectively, of FIG. 2. For purposes of brevity and clarity, a full discussion of the formation of the tunnel oxide layer and the nitride layer is presented in relation to operations 220 and 230 and will not be repeated here.

At 440, the present embodiment isolates a first area in the nitride layer. The first area corresponds to the formation of a SONOS based nonvolatile memory transistor. For example, a resist layer can be formed to isolate the region where the SONOS based nonvolatile memory transistor is subsequently formed. In particular, a second area in the nitride layer corresponds to where a first pass-gate MOS transistor is formed, wherein the first pass-gate MOS transistor is adjacent to where the SONOS based nonvolatile memory transistor is formed, and a third area in the nitride layer corresponds to where a second pass-gate MOS transistor is formed adjacent to SONOS based nonvolatile memory transistor. The SONOS based nonvolatile memory transistor and the first and second pass-gate MOS transistors are configured in a tri-gate SONOS based NVM configuration At 450, the present embodiment patterns and etches the nitride layer and the tunnel oxide layer in the second and third areas. Specifically, the tunnel oxide layer and the nitride layer are etched in the second and third areas corresponding to the formation of the first and second pass-gate MOS transistors. For purposes of embodiments of the present invention, etching the tunnel oxide layer and the nitride layer is analogous to removing the tunnel oxide layer and the nitride layer. As such, the silicon substrate is exposed in the second and third areas corresponding to the formation of the first and second pass-gate MOS transistors.

At 460, the present embodiment simultaneously forms oxide layers over remaining portions of the nitride layer over the first area, and over exposed areas of the silicon substrate corresponding to the second area and the third area. Specifically, a top oxide layer is formed over the nitride layer in the region corresponding to the formation of the SONOS based nonvolatile memory transistor. In addition, a gate oxide layer for the MOS transistors is simultaneously formed over the exposed silicon substrate.

Figure 5:
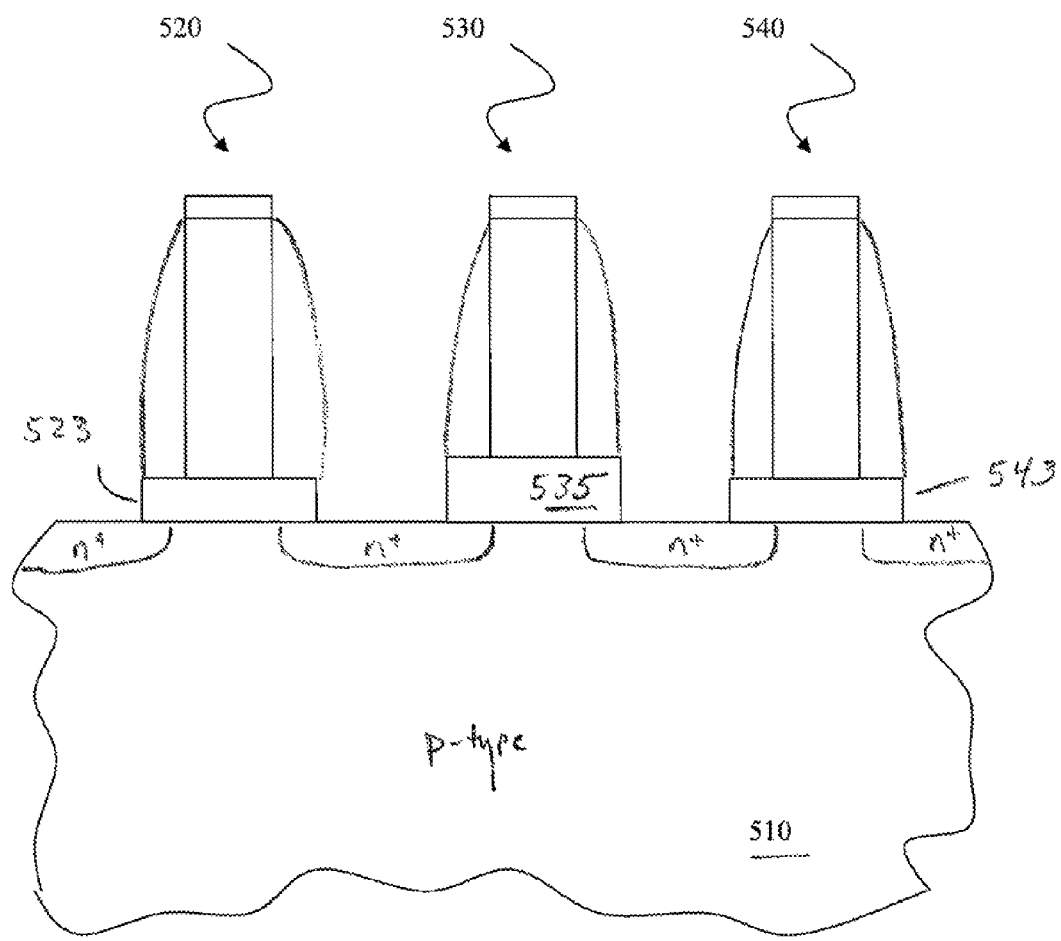
FIG. 5 is a simplified depiction of a tri-gate structure in cross section for a nonvolatile memory cell as a specific example of the simultaneous formation of oxide layers for a SONOS based nonvolatile memory transistor and at least one corresponding pass-gate MOS transistor, in accordance with one embodiment of the present invention.

FIG. 5 is a simplified illustration depicting a SONOS based NVM configuration 500 in cross section, in accordance with one embodiment of the present invention. The SONOS based NVM configuration 500 shown in FIG. 5 results from the process steps described in FIG. 2, and more particularly from FIG. 4, in accordance with one embodiment of the present invention. As such, the SONOS based NVM configuration 500 is fabricated such that the top oxide layer in at least one SONOS based nonvolatile memory transistor is formed simultaneously with the gate oxide layer over a silicon substrate from which is formed a gate oxide for at least one corresponding pass-gate MOS transistor. The at least one corresponding pass-gate MOS transistor controls access to the SONOS based nonvolatile memory transistor.

For example, NVM configuration 500 shown in FIG. 5 can be implemented within an nvSRAM memory array, in one embodiment. Other embodiments are well suited to using the NVM configuration 500 in other memory structures.

In one embodiment, FIG. 5 shows n-channel MOS transistors 520, 540 and an n-channel SONOS based transistor 530 formed over a p-type silicon substrate 510 for the NVM configuration 500. In other embodiments, the NVM configuration 500 can comprise any combination of n-channel and p-channel transistors built over n-type or p-type substrates.

The SONOS based NVM configuration 500 comprises a SONOS based nonvolatile memory transistor 530. The SONOS based nonvolatile memory transistor 530 comprises an ONO structure 535 which includes a tunnel oxide layer, a nitride layer, and a top oxide layer.

In addition, the SONOS based NVM configuration 500 comprises a first pass-gate MOS transistor 520 adjacent the SONOS based nonvolatile memory transistor 530. The first pass-gate MOS transistor 520 comprises a first gate oxide 523 that is formed simultaneously with the top oxide layer in the ONO structure 535. The oxidation rates for forming the top oxide layer of the SONOS based nonvolatile memory transistor and the first gate oxide 523 are different, which is reflected in the relative sizes of each layer. Specifically, the nitride layer in the ONO structure 535 of the SONOS based nonvolatile memory transistor is oxidized at a slower rate than the oxidation of the silicon substrate 510 that forms the gate oxide 523 of the pass-gate MOS transistor 520. As such, the gate oxide 523 is thicker than the top oxide layer in the ONO structure 535 over its distributed length. For instance, the thickness of the gate oxide 523 is approximately greater than or equal to twice the thickness of the top oxide layer in the ONO structure 535.

Since the first gate oxide 523 is formed simultaneously with the top oxide layer in the ONO structure 535 of the SONOS based nonvolatile memory transistor 530, the density of the top oxide layer in the ONO structure 535 is substantially similar to the density of the first gate oxide 523, in one embodiment.

Further, in another embodiment, the quality of top oxide layer in the ONO structure 535 formed through plasma oxidation is better than the quality of a top oxide layer formed through conventional deposition techniques. In particular, conventional deposition techniques will introduce more impurities into the top oxide layer than a top oxide layer that is formed through plasma oxidation techniques, in embodiments of the present invention.

In addition, the SONOS based nonvolatile memory cell 500 comprises a second pass-gate MOS transistor 540 adjacent the SONOS based nonvolatile memory transistor 530. The second pass-gate MOS transistor 525 comprises a second gate oxide 543 that is formed simultaneously with the top oxide layer in the ONO structure 535. The oxidation rates for forming the top oxide layer of the SONOS based nonvolatile memory transistor 530 and the second gate oxide 543 are different, which is reflected in the relative sizes of each layer. Specifically, the nitride layer in the ONO structure 535 in the SONOS based nonvolatile memory transistor is oxidized at a slower rate than the oxidation of the silicon substrate 510 that forms the second gate oxide 543 of the pass-gate MOS transistor 540. As such, the gate oxide 543 is thicker than the top oxide layer in the ONO structure 535. For instance, the thickness of the gate oxide 543 is approximately greater than or equal to twice the thickness of the top oxide layer in the ONO structure 535.

More particularly, the second gate oxide 543 is basically the same as the first gate oxide 523. As such, the density of the top oxide layer in the ONO structure 535 is substantially similar to the density of the second gate oxide 543, in one embodiment.

Accordingly, embodiments of the present invention provide for improved fabrication of a semiconductor chip comprising a SONOS based transistor and MOS transistors located in control circuitry. In particular, in one embodiment, the top oxide layer of the SONOS based nonvolatile memory transistor has a more uniform thickness. Also, in other embodiments, simultaneous fabrication of the top oxide layer of the SONOS based nonvolatile memory transistor and a gate oxide of at least one MOS transistor located in control circuitry reduces the number of processing steps, which saves the overall process costs for a semiconductor chip platform (e.g., a nonvolatile SRAM memory). In addition, in other embodiments, simultaneous formation of the top oxide layer in the ONO structure of the SONOS based nonvolatile memory transistor and the gate oxide of MOS transistor in the control circuitry improves the overall quality of the top oxide layer.

While the methods of embodiments illustrated in flow charts 2 and 4 show specific sequences and quantity of operations, the present invention is suitable to alternative embodiments. For example, not all the operations provided for in the methods presented above are required for the present invention. Furthermore, additional operations can be added to the operations presented in the present embodiments. Likewise the sequences of operations can be modified depending upon the application.

A method and apparatus illustrating the simultaneous formation of a top oxide layer in a SONOS based memory transistor and a gate oxide of at least one MOS transistor for control circuitry, is thus described. While the invention has been illustrated and described by means of specific embodiments, it is to be understood that numerous changes and modifications may be made therein without departing from the spirit and scope of the invention as defined in the appended claims and equivalents thereof. Furthermore, while the present invention has been described in particular embodiments, it should be appreciated that the present invention should not be construed as limited by such embodiments, but rather construed according to the below claims.

What is claimed:

1. A method for semiconductor fabrication, comprising:
   forming a tunnel oxide layer over a silicon substrate by applying a thermal oxidation technique at a first temperature;
   forming a nitride layer over said tunnel oxide layer;
   etching said nitride layer and said tunnel oxide layer except where at least one silicon oxide nitride oxide silicon (SONOS) transistor is formed;
   simultaneously forming a top oxide layer by applying a plasma oxidation technique at a second temperature lower than the first temperature to said nitride layer where said at least one SONOS transistor is formed and a gate oxide layer over said silicon substrate that is exposed corresponding to where at least one metal oxide semiconductor (MOS) transistor is formed.

2. The method of claim 1, wherein said simultaneously forming the top oxide layer oxide layer further comprises:
   forming the top oxide layer without performing densification of said top oxide layer.

3. The method of claim 1, wherein said etching said nitride layer comprises:
   forming a masking layer over an area where said at least one SONOS transistor is formed.

4. The method of claim 3, wherein said simultaneously forming the top and gate oxide layers comprises:
   removing said masking layer.

5. The method of claim 1, wherein said nitride layer comprises an oxynitride.

6. The method of claim 1, wherein said simultaneously forming the top oxide layer comprises:
   controlling a thickness of said top oxide layer.

7. The method of claim 1, wherein said SONOS transistor comprises a nonvolatile memory in a memory array; and
   said at least one MOS transistor is located peripherally from said memory array.

8. The method of claim 1, wherein said SONOS transistor comprises a nonvolatile memory in a memory array; and
   said at least one MOS transistor is located within said memory array.

* * * * *